_(12)_ United States Patent
Hauptman

(10) Patent No.: US 6,331,783 B1
(45) Date of Patent: *Dec. 18, 2001

(54) CIRCUIT AND METHOD FOR IMPROVED TEST AND CALIBRATION IN AUTOMATED TEST EQUIPMENT

(75) Inventor: Steven Hauptman, Camarillo, CA (US)

(73) Assignee: Teradyne, Inc., Boston, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/420,497

(22) Filed: Oct. 19, 1999

(51) Int. Cl.[7] .................................................. G01R 15/12
(52) U.S. Cl. ....................................... 324/765; 324/158.1
(58) Field of Search ............................... 324/158.1, 73.1, 324/765, 763; 714/726, 733, 700, 724; 438/14, 18; 257/48

(56) References Cited

U.S. PATENT DOCUMENTS

| | | | |
|---|---|---|---|
| 4,354,268 | * 10/1982 | Michel et al. ........................ | 702/120 |
| 4,799,008 | 1/1999 | Kannari ............................... | 324/73 R |
| 4,806,852 | * 2/1989 | Swan et al. ........................... | 714/744 |
| 5,101,153 | 3/1992 | Morong, III . | |
| 5,389,990 | 2/1995 | Nakamura . | |
| 5,402,079 | 3/1995 | Levy . | |
| 5,621,329 | 4/1997 | Tsao et al. ............................ | 324/601 |
| 5,812,424 | 9/1998 | Chikyu . | |
| 5,821,529 | 10/1998 | Chihara et al. . | |
| 5,917,331 | 6/1999 | Persons . | |
| 6,133,725 | * 10/2000 | Bowhers ............................ | 324/158.1 |

OTHER PUBLICATIONS

Patents Abstracts of Japan, vol. 1998, No. 02, Jan. 30, 1998 & JP 09281188A (Advantest Corp.), Oct. 31, 1997 abstract.

Aromat Corporation, "Photo MOS Relay is being used to replace reed relay", view slide fax, Jun. 20, 1997 (best available copy).

* cited by examiner

_Primary Examiner_—Vinh P. Nguyen
(74) _Attorney, Agent, or Firm_—Lance Kreisman

(57) ABSTRACT

An apparatus for testing and calibration in automated test equipment includes a time varying signal channel having a series-connected solid state switch interposed between a time varying signal circuit end and a device under test end of the time varying signal channel. A DC test channel is connected to the time varying signal channel between the series-connected solid state switch and the device under test end, and has at least one solid state switch interposed along the DC test channel to provide switchable coupling between a DC parametrics circuit side of the DC test channel and the time varying signal channel. A time varying signal level calibration channel is connected to the time varying signal channel between the series-connected solid state switch and the time varying signal circuit end, and has at least one solid state switch interposed along the signal level calibration to provide switchable coupling between a DC parametrics circuit side of the signal level calibration channel and the time varying signal channel. The time varying signal channel may have a low resistance type solid state switch, while the DC test channel, the signal level calibration channel, or both, may have low capacitance type solid state switches. Thus, opto-coupled MOSFETS, pin diodes, or other kind of solid state switches, may be utilized. The DC test channel, or the signal level calibration channel, or both, may have a force branch and a sense branch each having a solid state switch.

34 Claims, 3 Drawing Sheets

CIRCUIT AND METHOD FOR IMPROVED TEST AND CALIBRATION IN AUTOMATED TEST EQUIPMENT

BACKGROUND

Automatic test equipment or ATE is used to test semiconductor or other type devices at various stages of manufacture. An ATE tester generates signals, supplies the signals to a device under test or DUT, and monitors the responses to these signals to evaluate the fitness of the DUT. These signals include DC signals, and time varying signals such as AC, pulsed, or other periodic signals.

To provide these signals with precision, testers employ DC circuitry, and time varying signal circuitry sometimes referred to as pin electronics circuitry. Separate circuits are used because the circuits capable of providing and measuring precision DC signals are not capable of providing and measuring precision high frequency signals. Likewise, precision time varying signal circuits are not able to provide and measure precision DC signals. Thus, the tester must be capable of switching between these two circuits when testing a DUT.

Further, to maintain precise time varying signal characteristics, testers must be capable of performing self calibration. Self calibration includes signal level calibration as well as signal timing calibration. Thus, the tester also must provide this switching for calibration.

FIG. 1 shows a "T" switching circuit commonly used in prior art ATE testers to perform such switching. Relays typically are employed to provide switching. Relay switches facilitate precision testing by providing low closed resistance and low open capacitance. This allows accurate transmission and measurement of signal timing and signal levels over a wide bandwidth and range of signal levels. Thus, with appropriate relay switching, the "T" switching circuit is able to provide low resistance and low capacitance transmission paths between the time varying signal circuitry 10 and the DUT 30, between the DC test/time varying signal calibration circuitry 20 and the DUT 30, as well as between the time varying signal circuitry 10 and the DC test/time varying signal calibration circuitry 20.

Relays, however, have a significant drawback. Relays have a relatively low mean time before failure or MTBF as compared to other tester components. One cause of the low MTBF of relays is polymer build-up on the surface of the relay contacts. Contacts are susceptible to polymer build-up when switched dry rather than under an applied current or voltage. Such polymer build-up increases contact resistance. Moreover, the resistance caused by polymer build-up varies each time the contacts are closed. This is particularly true in relays designed for high bandwidth applications. In such applications, relays having small contacts to provide lower capacitance along the high frequency transmission line also have a reduced spring force, which facilitates resistance variations in polymerized contacts. In testers designed to test devices 125 Mhz–500 Mhz or greater, relays normally having only a fraction of an ohm resistance, can develop several ohms of resistance. This results in each closure of the relay leading to a different resistance value, which affects measurement precision and, consequently, the reliability of the tester. As such, relays contribute to tester down time, slowing production and reducing product margins. To compete in semiconductor and other electronic devices markets, manufacturers require more reliable test equipment.

Solid state switches, on the other hand, generally have orders of magnitude higher MTBF. Solid state switches, however, are not capable of providing the same low resistance and capacitance as relays. FIG. 2 illustrates a comparison of resistance verses capacitance characteristics of solid state switches and relays. Whereas the product of the closed resistance and open capacitance of a high frequency relay can be on the order of 0.07 pF-Ohms, the best commercially available solid state devices provide only about 15–40 pF-Ohms.

As such, although replacing RELAY1, RELAY2, and RELAY3, of FIG. 1 with a solid state switch could improve MTBF, it also impermissibly impairs the capabilities of the tester. This is particularly true in high frequency applications, where the bandwidth of the time varying signal is limited by the capacitance of the time varying transmission channel. Furthermore, increased resistance limits precision of DC signal measurement and of time varying signal calibration.

SUMMARY

A preferred embodiment of the present invention provides a switching circuit for testing and calibration in automated test equipment having a time varying signal channel, a DC test channel, and a time varying signal level calibration channel. The time varying signal channel has a series-connected solid state switch interposed between a time varying signal circuit end and a device under test end of the time varying signal channel.

The DC test channel is connected to the time varying signal channel between the series-connected solid state switch and the device under test end. The DC test channel has at least one solid state switch interposed along the DC test channel so as to provide switchable coupling between a DC parametrics circuit side of the DC test channel and the time varying signal channel.

The time varying signal level calibration channel is connected to the time varying signal channel between the series-connected solid state switch and the time varying signal circuit end. The signal level calibration channel has at least one solid state switch interposed along the signal level calibration channel so as to provide switchable coupling between a DC parametrics circuit side of the signal level calibration channel and the time varying signal channel.

In more preferred embodiments, the DC test channel, the signal level calibration channel, or both, may have a force branch and a sense branch each having a solid state switch. In some embodiments, the time varying signal channel has a low resistance type solid state switch, while the DC test channel, the signal level calibration channel, or both, have low capacitance type solid state switches. Moreover, in some embodiments it is preferred to have optically coupled metal oxide semiconductor field effect transistor switches within some, or all, of the time varying signal channel, the DC test channel, and the signal level calibration channel.

DESCRIPTION OF PREFERRED EMBODIMENTS AND METHODS OF THE PRESENT INVENTION

Figure 1:
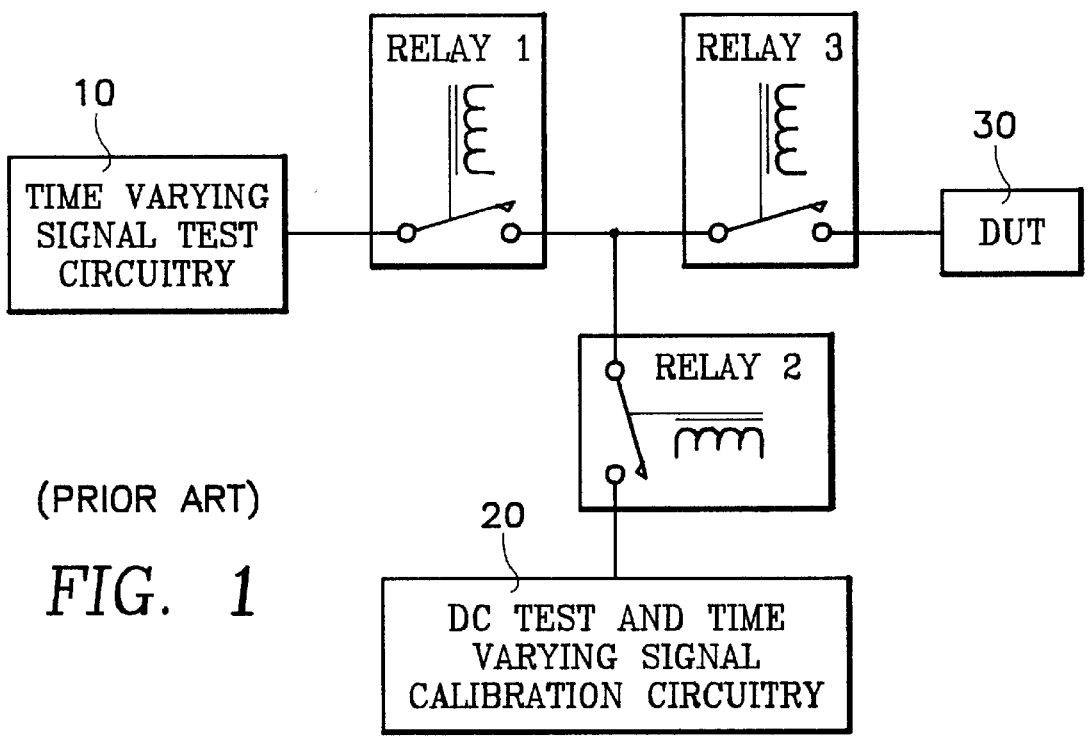
FIG. 1 show a prior art test and calibration relay switching circuit.
Figure 2:
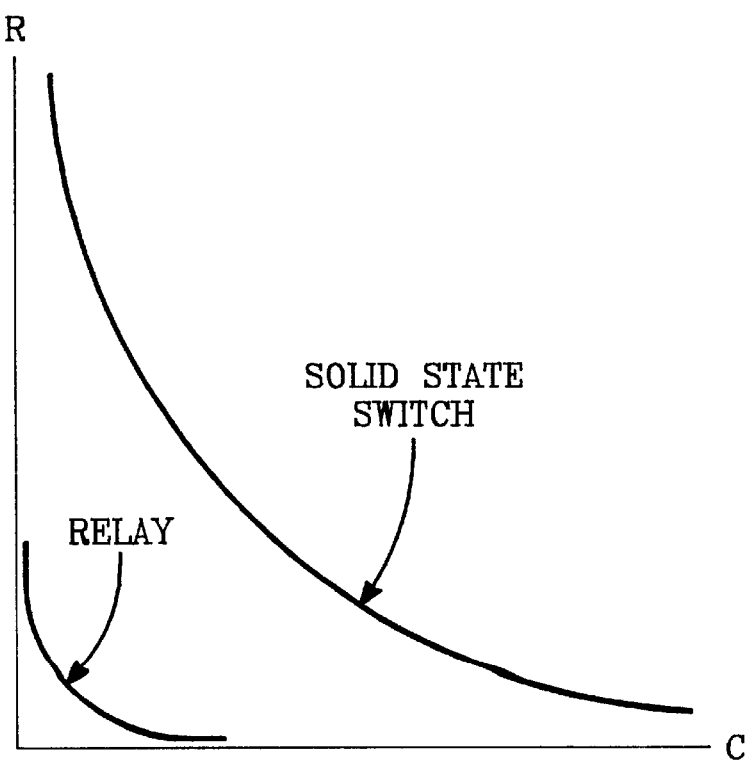
FIG. 2 illustrates a comparison of resistance and capacitance characteristics of a relay and solid state switches.
Figure 3:
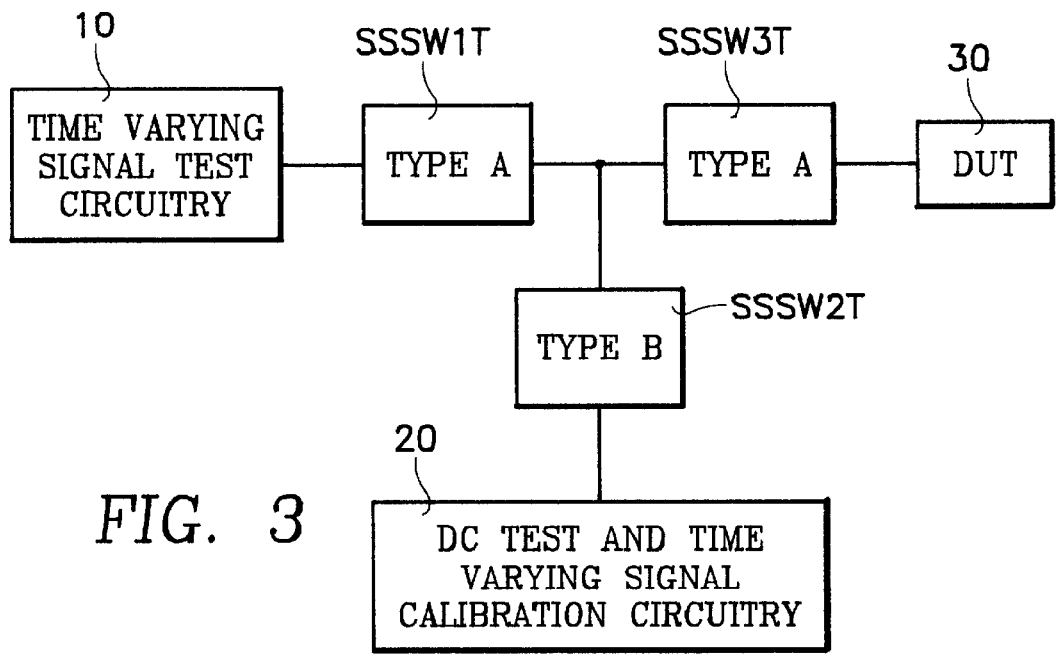
FIG. 3 shows a possible implementation employing solid state switches.

FIG. 3 shows a possible implementation to improve solid state switching. In this implementation, two types of solid state switches are used. A type A solid state switch having low resistance when closed and high capacitance when open, and a TYPE B solid state switch having low capacitance when open and high resistance when closed. Type A switches, SSSW1T and SSSW3T, couple the time varying signal circuitry 10 and the DUT 30 to form a time varying signal channel. A type B switch SSSW2T couples the DC test and time varying signal calibration circuitry to the time varying signal channel.

In this implementation, using different solid state switch types, one adapted to provide low resistance and one adapted to provide low capacitance, mitigates some of the shortcomings of solid state switching. During time varying signal testing, the time varying signal channel transmission path resistance is provided through low resistance type A switches SSSW1 and SSSW3, while the open type B switch SSSW2T, provides low capacitance along the time varying signal transmission path.

With this implementation, however, DC signal testing of the DUT 30 is conducted via a high resistance type B switch SSSW2T. This reduces precision of DC signal testing of the DUT 30. Further, this also occurs during calibration of the time varying signal circuitry 10, as the time varying signal circuitry 10 is coupled to the calibration circuitry 20 via high resistance type SSSW2T.

Figure 4:
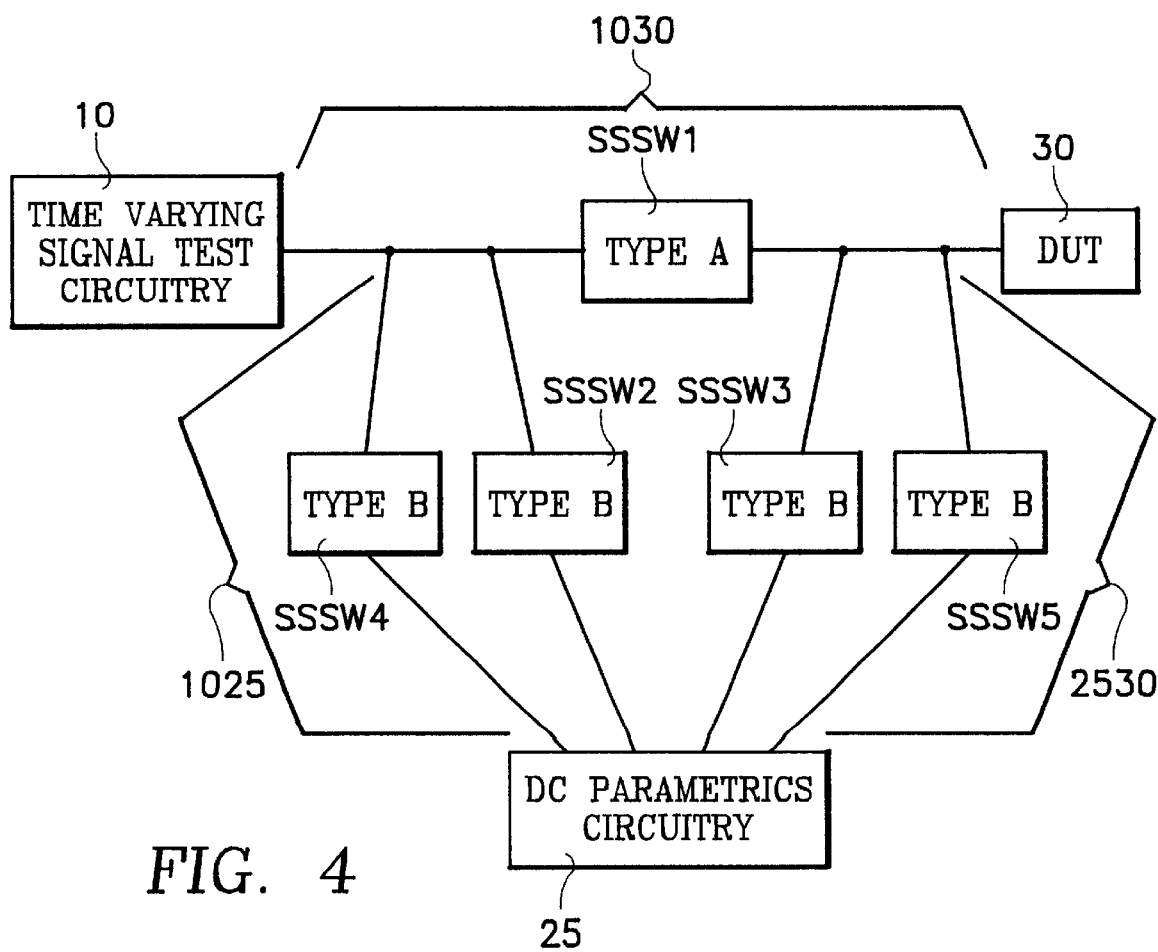
FIG. 4 shows a preferred embodiment of improved ATE test and calibration circuitry in accordance with the present invention.

FIG. 4 shows a preferred embodiment of the present invention. In this embodiment, a time varying signal channel 1030 connects the time varying signal circuitry 10 to the DUT 30. The time varying signal channel 1030 has a series-connected solid state switch SSSW1 capable of switchably coupling the time varying signal test circuitry 10 to the DUT 30.

A DC test channel 2530 is connected to the time varying signal channel 1030 so as to couple the DC parametric circuitry 25 to the DUT 30. The DC test channel 2530 is connected to the time varying signal channel 1030 between the solid state switch SSSW1 and a DUT end of the time varying signal channel 1030. At least one solid state switch of SSSW3 and SSSW5 is interposed Ii; along the DC test channel 2530 so as to provide switchable coupling of the DC parametrics circuitry 25 to the DUT 30. In the embodiment of FIG. 4, it is preferred to provide two solid state switches, SSSW3 and SSSW5, to provide switchable coupling between the DC parametrics circuit 25 and the DUT 30, as will be discussed further below. Thus, solid state switches SSSW3 and SSSW5 couple the DC parametric circuit 25 to the DUT 30 independent of, and not in series with, the series-connected switch SSSW1.

A signal level calibration channel 1025 is connected to the time varying signal channel 1030 so as to couple the DC parametric circuitry 25 to the time varying signal circuitry 10. At least one solid state switch of SSSW2 and SSSW4 is interposed along the signal level calibration channel 1025 so as to provide switchable coupling of the DC parametrics circuitry 25 to the time varying signal circuitry 10. In the embodiment of FIG. 4, it is preferred to provide two solid state switches, SSSW2 and SSSW4, to provide switchable coupling between the DC parametrics circuit 25 and the time varying signal circuitry 10, as will be discussed further below. Thus, solid state switches SSSW2 and SSSW4 couple the DC parametric circuit 25 to the time varying signal circuit 10 independent of, and not in series with, the series-connected switch SSSW1.

The configuration of FIG. 4 allows time varying and DC signal testing of the DUT 30, self calibration of the time varying signal levels, as well as isolation of the time varying circuit 10 from the time varying signal channel 1030 for fault diagnosis. DUT testing using time varying signals is performed via the time varying signal channel 1030, with SSSW1 closed and SSSW2–SSSW5 open. DC signal testing of the DUT 30 is performed via the DC test channel 2530, with SSSW3 and SSSW5 closed and SSSW1, SSSW2, and SSSW4 open. Calibration of time varyingsignal levels is performed via the signal level calibration channel 1025, with SSSW2 and SSSW4 closed and SSSW1, SSSW3, and SSSW5 open.

Also with this configuration, it is possible to perform fault diagnosis of the time varying signal channel 1030 on its DUT side, between SSSW1 and the DUT, by closing SSSW1. For example, this isolation allows verification of the functionality of the terminals used to contact the time varying signal channel 1030 to the DUT 30. Faults such as terminal shorting, for example, could be isolated with this embodiment. This capability is particularly desirable in ATE used for testing devices with high pin counts. For example, in ATE adapted to test 12,000 or more pins, isolation of the DUT side of the time varying signal channel 1030 is essential.

In the embodiment of FIG. 4, it is preferred to utilize low resistance type A and low capacitance type B solid state switches to provide improved channel characteristics when using solid state switches. A low closed resistance type A solid state switch is serially-connected in the time varying signal channel 1030. Low open capacitance type B solid state switches are interposed along the DC test channel 2530 and the signal level calibration channel 1025 so as to provide switchable coupling between the DC parametrics circuit 25 and the time varying signal channel 1030.

Thus, during time varying signal testing, the time varying signal passes through a low resistance switch SSSW1. Furthermore, switches SSSW2–SSSW5 provide low capacitance when open during time varying signal testing. As a result, the embodiment of FIG. 4 provides a high bandwidth time varying signal channel 1030, thus allowing high frequency signal transmission through the time varying signal channel 1030.

In some embodiments, it is preferred to locate the solid state switch SSSW1 proximate to the time varying signal circuitry 10 to facilitate signal transmission along the time varying signal channel 1030. As such, the sum of the output impedance of the time varying signal circuit 10 and the closed SSSW1 appears the output impedance which is matched with the characteristic impedance of the DUT side of the time varying signal channel 1030. For example, in one embodiment, an opto-coupled MOSFET or optically coupled metal oxide semiconductor field effect transistor switch having a closed resistance of about 2 to 3 Ohms is used. In such an embodiment, SSSW1 is located about 1–2 cm from the time varying signal test circuitry 10.

With this implementation, DC signal testing of the DUT 30 and signal level calibration of the time varying signal is conducted via high resistance type B switches. In high end ATE testers, DC testing and signal level calibration through high resistance type switches can unacceptably reduce measurement precision. To overcome this, in the embodiment of FIG. 4, it is preferred that one or both of these channels 2530 and 1025 have a force signal path or branch and a sense signal path or branch. In the embodiment of FIG. 4, SSSW3 is provided in the force branch of the DC test channel 2530, while SSSW5 is provided in the sense branch of DC test channel 2530. The DC test channel 2530 sense branch provides feedback for controlling DC current or voltage at the sense branch connection to the time varying signal channel 1030. Further, in the embodiment of FIG. 4, SSSW2 is provided in the force branch of the signal level calibration channel 1025, while SSSW4 is provided in the sense branch of the signal level calibration channel 1025. As such, the signal level calibration channel 1025 sense branch provides feedback for controlling DC current or voltage at the sense branch connection to the time varying signal channel 1030.

Figure 5:
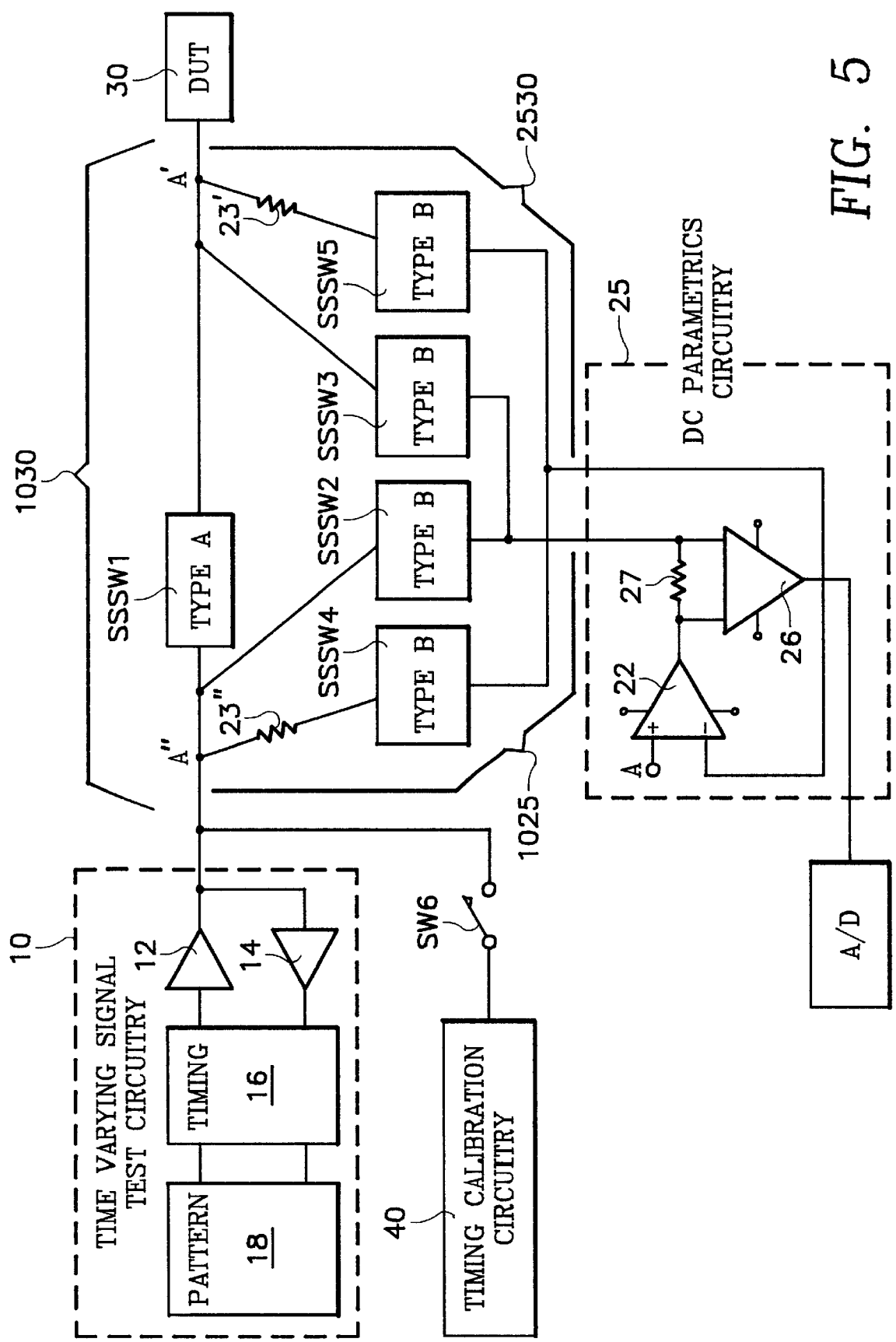
FIG. 5 shows a preferred embodiment of improved ATE test and calibration circuitry in accordance with the present invention.

Turning to FIG. 5, in this embodiment, the DC parametric circuitry 25 is capable of generating and evaluating signal levels using operation amplifiers 22 and 26. In this embodiment, a force voltage is applied to the non-inverting input of operational amplifier 22. High resistance, such as 10k Ohms, is provide in the feedback path. Thus, the operational amplifier 22 forces the voltage at point A' to match the voltage at point A when testing the DUT, or forces the voltage at point A" to match the voltage at point A when performing signal level calibration of the time varying signal circuitry 10. Another operational amplifier 24 detects current flow through resistor 27 and provides an output to an A/D converter for evaluation by a digital circuitry or computer (not shown).

Although resistance may be provided anywhere in the feedback path to the operational amplifier 22, in this embodiment, resistors 23' and 23" are provided in the sense branches of the DC test and the signal level calibration channels 2530 and 1025, respectively. As such, in this embodiment, the sense branches each include feedback resistance. Furthermore, in some embodiments, it preferred to locate the resistors within the sense branches close to the time varying signal channel 1030 so as to reduce capacitance along the time varying signal channel 1030 to improve its high frequency performance.

As such, precision DC voltage may be generated at point A' for evaluation of DC performance of the DUT 30, and at point A" for calibration of the voltage level of the time varying signal. Because SSSW3 and SSSW5 are located in the force and sense branches of the DC test channel 2530, the high resistance of these switches does not affect the DC signal level at A'. Likewise, the high resistance SSSW2 and SSSW4, located in the force and sense branches of the time varying signal level calibration channel 1025, does not affect signal level at A". Thus, the voltage at A' and A" is generated irrespective of switch resistance in the DC test and time varying signal level calibration channels 1030 and 1025. Although the above embodiment is described with reference to forcing voltage and measuring current, one skilled in the art will recognize that, alternatively, it is possible to force current and measure voltage.

With the embodiment of FIG. 5, the DC parametric circuitry 25 is utilized to calibrate the time varying signal level. It is preferred in this embodiment to provide separate timing calibration circuitry 40 for calibrating the timing characteristics of the time varying signal circuit 10. The time calibration circuit may be coupled to the time varying signal channel 1030 via switch SW6, such as a relay or a solid state switch. Variations in signal level at the timing calibration circuitry 40 is not critical to timing calibration as is the case in signal level calibration. Thus, build-up on a relay contact is not critical because the time varying signal level is calibrated separately by the DC parametrics circuitry 25 via the signal level calibration channel 1025. In some embodiments, the timing calibration circuit 40 may include a time domain reflectometer or TDR for determining the path length of the time varying signal channel 1030 for use in timing calibration.

As depicted in FIG. 5, in one embodiment, the time varying signals are supplied by pattern and timing circuits 18 and 16 to an output buffer 12 for transmission along the time varying signal channel 1030. The time varying signal may be A/C, pulsed, or the like. An input buffer 14 receives signals from the time varying signal channel 1030 and provides them to the timing and pattern circuits 16 and 18 for evaluation.

With the present invention, any kind of solid state switch appropriate for the desired test signal frequency and levels may be utilized for SSSW1–SSSW5. Furthermore, the solid state switches all may be a single kind of switch, or different kinds may be utilized in different positions. For example, all optically coupled metal oxide semiconductor field effect transistor switches, pin diode switches, or the like may be utilized. As a further non-exclusive example, one kind of solid state switch fabricated as a low capacitance type switch, may be used in the DC test and signal level calibration channels 2530 and 1025, while another kind of solid state switch fabricated as a low resistance type switch, may be used in the time varying signal channel 1030. For example, optically coupled metal oxide semiconductor field effect transistor switches could be used for SSSW2–SSSW5 while a pin diode could be used for SSSW1.

While the preferred embodiments of the present invention have been described in detail above, many changes to these embodiments may be made without departing from the true scope and teachings of the present invention. The present invention, therefore, is limited only as claimed below and the equivalents thereof.

What we claim is:

1. A switching circuit for testing and calibration in automated test equipment comprising:
   a) a time varying signal channel having a time varying signal circuit end and a device under test end, the time varying signal channel comprising a series-connected solid state switch;
   b) a DC test channel connected to the time varying signal channel between the series-connected solid state switch and the device under test end, the DC test channel comprising at least one solid state switch interposed along the DC test channel so as to provide switchable coupling between a DC parametrics circuit side of the DC test channel and the time varying signal channel; and
   c) a signal level calibration channel connected to the time varying signal channel between the series-connected solid state switch and the time varying signal circuit end, the signal level calibration channel comprising at least one solid state switch interposed along the signal level calibration channel so as to provide switchable coupling between a DC parametrics circuit side of the signal level calibration channel and the time varying signal channel.

2. The circuit of claim 1 wherein at least one of the DC test channel and the signal level calibration channel comprises a force branch and a sense branch, the force branch and the sense branch each comprising a solid state switch.

3. The circuit of claim 2 wherein the DC test channel comprises a force branch and a sense branch each comprising a solid state switch, and wherein the signal level calibration channel comprises a force branch and a sense branch each comprising a solid state switch.

4. The circuit of claim 3 wherein the time varying signal channel comprises a low resistance type solid state switch, and wherein the DC test channel and the signal level calibration channel comprise low capacitance type solid state switches.

5. The circuit of claim 4 further comprising a signal timing calibration channel switchably coupled to the time varying signal channel.

6. The circuit of claim 4 wherein at least one of the time varying signal channel, the DC test channel, and the signal level calibration channel comprises optically coupled metal oxide semiconductor field effect transistors.

7. The circuit of claim 6 wherein all of the solid state switches comprise optically coupled metal oxide semiconductor field effect transistors.

8. The circuit of claim 1 wherein the time varying signal channel comprises a low resistance type solid state switch, and wherein at least one of the DC test channel and the signal level calibration channel comprises at least one low capacitance type solid state switch.

9. The circuit of claim 8 wherein both the DC test channel and the signal level calibration channel comprise low capacitance type solid state switches.

10. The circuit of claim 9 wherein the solid state switches of the time varying signal channel, the DC test channel, and signal level calibration channel all comprise optically coupled metal oxide semiconductor field effect transistors.

11. The circuit of claim 10 wherein the DC test channel comprises a force branch and a sense branch each comprising a solid state switch, and wherein the signal level calibration channel comprises a force branch and a sense branch each comprising a solid state switch.

12. The circuit of claim 1 comprising optically coupled metal oxide semiconductor field effect transistors.

13. The circuit of claim 1 comprising pin diodes.

14. The circuit of claim 1 comprising optically coupled metal oxide semiconductor field effect transistors.

15. The circuit of claim 1 wherein the solid state switch of the time varying signal channel is disposed proximate to the time varying signal circuit end of the time varying signal channel.

16. The circuit of claim 1 further comprising a signal timing calibration channel switchably coupled to the time varying signal channel.

17. A circuit for testing and calibration in automated test equipment comprising:
   a) a time varying signal circuit adapted to generate and evaluate time varying signals;
   b) a DC parametric circuit adapted to generate and evaluate DC signals levels and to evaluate time varying signal levels;
   c) a time varying signal channel coupled to the time varying signal circuit and having a device under test end, the time varying signal channel comprising a series-connected solid state switch;
   d) a DC test channel coupled to the time varying signal channel between the series-connected solid state switch and the device under test end, the DC test channel comprising at least one solid state switch so as to provide switchable coupling of the DC parametric circuit and time varying signal channel; and
   e) a signal level calibration channel coupled to the time varying signal channel between the series-connected solid state switch and the time varying signal circuit, the signal level calibration channel comprising at least one solid state switch so as to provide switchable coupling of the DC parametric circuit and the time varying signal channel.

18. The circuit of claim 17 wherein the time varying signal channel comprises a low resistance type solid state switch, and wherein the DC signal channel and the signal level calibration channel comprise low capacitance type solid state switches.

19. The circuit of claim 18 wherein the DC test channel comprises a force and a sense branch each comprising a solid state switch, and wherein the signal level calibration channel comprises a force branch and a sense branch each comprising a solid state switch.

20. The circuit of claim 19 comprising optically coupled metal oxide semiconductor field effect transistors.

21. The circuit of claim 19 further comprising a signal timing calibration circuit switchably coupled to the time varying signal channel.

22. The circuit of claim 17 comprising optically coupled metal oxide semiconductor field effect transistors.

23. The circuit of claim 17 comprising pin diodes.

24. The circuit of claim 17 wherein the DC test channel comprises a force and a sense branch each comprising a solid state switch, and wherein the signal level calibration channel comprises a force branch and a sense branch each comprising a solid state switch.

25. The circuit of claim 17 wherein the solid state switch of the time varying signal channel is disposed proximate to the time varying signal circuit.

26. A method for testing and calibration in automated test equipment comprising:
   a) controlling coupling between a time varying signal circuit and a device under test using a series-connected solid state switch;
   b) controlling coupling between a DC parametric circuit and the device under test using at least one solid state switch coupling the DC parametric circuit to the device under test independent of the series-connected solid state switch; and
   c) controlling coupling between the DC parametric circuit and the time varying signal circuit using at least one solid state switch coupling the DC parametric circuit to the time varying signal circuit independent of the series-connected solid state switch.

27. The method of claim 26 wherein controlling coupling between the time varying signal circuit and the device under test comprises using a low resistance type solid state switch, and wherein controlling coupling between the DC parametric circuit and the device under test comprises using low capacitance type solid state switches, and wherein controlling coupling between the DC parametric circuit and the time varying signal circuit comprises using low capacitance type solid state switches.

28. The method of claim 27 wherein controlling coupling between the DC parametric circuit and the device under test and controlling coupling between the DC parametric circuit and the time varying signal circuit comprises controlling coupling of force and sense signals.

29. The method of claim 28 wherein controlling coupling between the time varying signal circuit and the device under test, controlling coupling between the DC parametric circuit and the device under test, and controlling coupling between the DC parametric circuit and the time varying signal circuit comprises using optically coupled metal oxide semiconductor field effect transistors.

30. The method of claim 28 wherein controlling coupling between the time varying signal circuit and the device under test, controlling coupling between the DC parametric circuit and the device under test, and controlling coupling between the DC parametric circuit and the time varying signal circuit comprises using pin diodes.

31. The method of claim 26 wherein controlling coupling between the time varying signal circuit and the device under test, controlling coupling between the DC parametric circuit and the device under test, and controlling coupling between the DC parametric circuit and the time varying signal circuit comprises using optically coupled metal oxide semiconductor field effect transistors.

32. The method of claim 26 wherein controlling coupling between the time varying signal circuit and the device under test, controlling coupling between the DC parametric circuit and the device under test, and controlling coupling between the DC parametric circuit and the time varying signal circuit comprises using pin diodes.

33. The method of claim 26 wherein controlling coupling between the DC parametric circuit and the device under test and controlling coupling between the DC parametric circuit and the time varying signal circuit comprises controlling coupling of force and sense signals.

34. The method of claim 26 further comprising controlling coupling between a signal timing calibration circuit and the using a switch coupling the signal timing calibration circuit to the time varying signal circuit independent from the series connected solid state switch.

* * * * *